United States Patent
Chen et al.

(10) Patent No.: US 9,929,007 B2
(45) Date of Patent: *Mar. 27, 2018

(54) E-FLASH SI DOT NITROGEN PASSIVATION FOR TRAP REDUCTION

(71) Applicant: Taiwan Semiconductor Manufacturing Co., Ltd., Hsin-Chu (TW)

(72) Inventors: Chih-Ming Chen, Hsinchu (TW); Tsu-Hui Su, Taipei (TW); Szu-Yu Wang, Hsinchu (TW); Chung-Yi Yu, Hsin-Chu (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/583,291

(22) Filed: Dec. 26, 2014

(65) Prior Publication Data

US 2016/0190349 A1 Jun. 30, 2016

(51) Int. Cl.
*H01L 29/792* (2006.01)
*H01L 21/02* (2006.01)
(Continued)

(52) U.S. Cl.
CPC .... *H01L 21/02247* (2013.01); *H01L 21/0217* (2013.01); *H01L 21/02164* (2013.01);
(Continued)

(58) Field of Classification Search
CPC ......... H01L 21/02247; H01L 21/02164; H01L 21/0217; H01L 21/28273; H01L 21/28282; H01L 29/16
(Continued)

(56) References Cited

U.S. PATENT DOCUMENTS 5,852,306 A 12/1998 Forbes
6,090,666 A * 7/2000 Ueda ..................... B82Y 10/00
117/87
(Continued)

OTHER PUBLICATIONS

Crippa, et al. "Nonvolatile Memories: NOR vs. NAND Architectures." Memories in Wireless Systems, Springer-Verlag Berlin Heidelberg, 2008.
(Continued)

*Primary Examiner* — Ori Nadav
(74) *Attorney, Agent, or Firm* — Eschweiler & Potashnik, LLC

(57) ABSTRACT

The present disclosure relates to a structure and method for reducing dangling bonds around quantum dots in a memory cell. In some embodiments, the structure has a semiconductor substrate having a tunnel dielectric layer disposed over it and a plurality of quantum dots disposed over the tunnel dielectric layer. A passivation layer is formed conformally over outer surfaces of the quantum dots and a top dielectric layer is disposed conformally around the passivation layer. The passivation layer can be formed prior to forming the top dielectric layer over the quantum dots or after forming the top dielectric layer. The passivation layer reduces the dangling bonds at an interface between the quantum dots and the top dielectric layer, thereby preventing trap sites that may hinder operations of the memory cell.

21 Claims, 6 Drawing Sheets

(51) Int. Cl.
*H01L 29/66* (2006.01)
*H01L 29/423* (2006.01)
*H01L 21/28* (2006.01)

(52) U.S. Cl.
CPC .. *H01L 21/28273* (2013.01); *H01L 21/28282* (2013.01); *H01L 29/42344* (2013.01); *H01L 29/42348* (2013.01); *H01L 29/66833* (2013.01); *H01L 29/7923* (2013.01); *H01L 21/02252* (2013.01); *H01L 21/02255* (2013.01)

(58) Field of Classification Search
USPC .......................................... 257/298, 314–326
See application file for complete search history.

(56) References Cited

U.S. PATENT DOCUMENTS

| | | | | |
|---|---|---|---|---|
| 6,297,095 | B1* | 10/2001 | Muralidhar | B82Y 10/00 257/E21.404 |
| 6,413,819 | B1* | 7/2002 | Zafar | B82Y 10/00 257/E21.209 |
| 6,531,731 | B2* | 3/2003 | Jones, Jr. | B82Y 10/00 257/30 |
| 6,774,061 | B2 | 8/2004 | Coffa et al. | |
| 6,808,986 | B2* | 10/2004 | Rao | B82Y 10/00 257/E21.101 |
| 7,101,760 | B1 | 9/2006 | Lojek | |
| 7,121,474 | B2* | 10/2006 | Bourianoff | G11C 11/21 235/494 |
| 7,301,172 | B2* | 11/2007 | Atwater | B82Y 20/00 257/79 |
| 7,432,158 | B1* | 10/2008 | Rao | B82Y 10/00 257/E21.209 |
| 7,517,747 | B2* | 4/2009 | Muralidhar | B82Y 10/00 257/E21.68 |
| 7,579,646 | B2 | 8/2009 | Wang et al. | |
| 7,595,528 | B2* | 9/2009 | Duan | B82Y 10/00 257/20 |
| 7,687,349 | B2* | 3/2010 | Coppard | B82Y 10/00 257/E21.681 |
| 7,932,189 | B2* | 4/2011 | Merchant | B82Y 10/00 257/E21.21 |
| 8,163,609 | B2* | 4/2012 | Hong | B82Y 10/00 257/314 |
| 2002/0140022 | A1 | 10/2002 | Lin et al. | |
| 2003/0075756 | A1 | 4/2003 | Suzuki | |
| 2006/0046383 | A1 | 3/2006 | Chen et al. | |
| 2006/0251561 | A1 | 11/2006 | Farrell et al. | |
| 2007/0145468 | A1 | 6/2007 | Majumdar et al. | |
| 2008/0121966 | A1* | 5/2008 | Muralidhar | B82Y 10/00 257/315 |
| 2008/0296658 | A1* | 12/2008 | Maurelli | B82Y 10/00 257/321 |
| 2009/0039407 | A1 | 2/2009 | Vora | |
| 2010/0155909 | A1 | 6/2010 | Ramappa et al. | |
| 2011/0263129 | A1 | 10/2011 | Shin et al. | |
| 2012/0267616 | A1 | 10/2012 | Jang et al. | |
| 2012/0267699 | A1 | 10/2012 | Kiyotoshi | |
| 2012/0292683 | A1 | 11/2012 | Loiko et al. | |
| 2013/0207053 | A1 | 8/2013 | Gonen Williams et al. | |
| 2013/0207174 | A1 | 8/2013 | Wang et al. | |

OTHER PUBLICATIONS

Li, et al. "Fabrication and Properties of Nano-Si Quantum Dot Flash Memory." Solid-State and Integrated Circuit Technology, 2006. ICSICT '06. 8th International Conference. Oct. 2006.

Muralidhar, et al. "A 6V Embedded 90nm Silicon Nanocrystal Nonvolatile Memory." Electron Devices Meeting, 2003. IEDM '03 Technical Digest. IEEE International. Dec. 2003.

www.semiconductor-today.com "Flash Fast Forward to Quantum Dot Memory." Semiconductor Today—Compounds and Advanced Silicon, vol. 3, Issue 5, Jun. 2008.

Chang, Ko Min. "SG-TFS: a Versatile Embedded Flash with Silicon Nanocrystals as the Storage Medium." Solid-State and Integrated-Circuit Technology, 2008. ICSICT 2008. 9th International Conference. Oct. 2008.

P. Chakraborty, et al.; "Nanocrystal Non-Volatile Flash Memory Devices: A Simulation Study"; IETE Mumbai Centre, Electronics and ECE Department, Kharagpur, India; 2007; p. D-46-D-50.

Wang, et al. "Efficient One-Pot Synthesis of Highly Photoluminescent Alkyl-Functionalised Silicon Nanocrystals." Chem, Commun., 2011, 47, 4941-4943. Published in 2011.

Wang, et al. "A General Strategy for Nanocrystal Synthesis." Nature. vol. 437, Sep. 1, 2005, doi:10.1038/nature03968.

Bigioni, et al. "Kinetically Driven Self Assembly of Highly Ordered Nanoparticlemonolayers." Nature Materials, vol. 5, Apr. 2006.

Sletnes, et al. "Octoxy Capped Si Nanoparticles Synthesized by Homogeneous Reduction of SiCl4 with Crown Ether Alkalide." Royal Society of Chemistry, Dalton Trans., 2014, 43, 2127. Published in 2014.

U.S. Appl. No. 14/261,539, filed Apr. 25, 2014.
U.S. Appl. No. 14/308,808, filed Jun. 19, 2014.

Jan Schmidt, et al.; "Surface Passivation of Silicon Solar Cells Using Plasma-Enhanced Chemical-Vapour-Deposited SiN Films and Thin Thermal SiO2/Plasma SiN Stacks"; Semiconductor Science and Technology; 2001; p. 164-170.

John Phelan; "Investigating the Influence of Interface and Vacancy Defects on the Growth of Silicon Quantum Dots in SiO2"; The School of Graduate and Postdoctoral Studies, The University of Western Ontario; 2013; p. 1-53.

U.S. Appl. No. 14/489,902, filed Sep. 18, 2014.
Final Office Action dated Feb. 16, 2016 U.S. Appl. No. 14/308,808.
Non-Final Office Action dated Jul. 10, 2015 in connection with U.S. Appl. No. 14/261,539.
Non Final Office Action dated Sep. 25, 2015 U.S. Appl. No. 14/489,902.
Non Final Office Action dated Oct. 14, 2015 U.S. Appl. No. 14/308,808.
Final Office Action dated Oct. 22, 2015 U.S. Appl. No. 14/261,539.
Notice of Allowance dated Mar. 21, 2016 U.S. Appl. No. 14/489,902.
Non Final Office Action dated Jul. 7, 2016 U.S. Appl. No. 14/308,808.
Notice of Allowance dated Oct. 7, 2016 U.S. Appl. No. 14/308,808.

\* cited by examiner

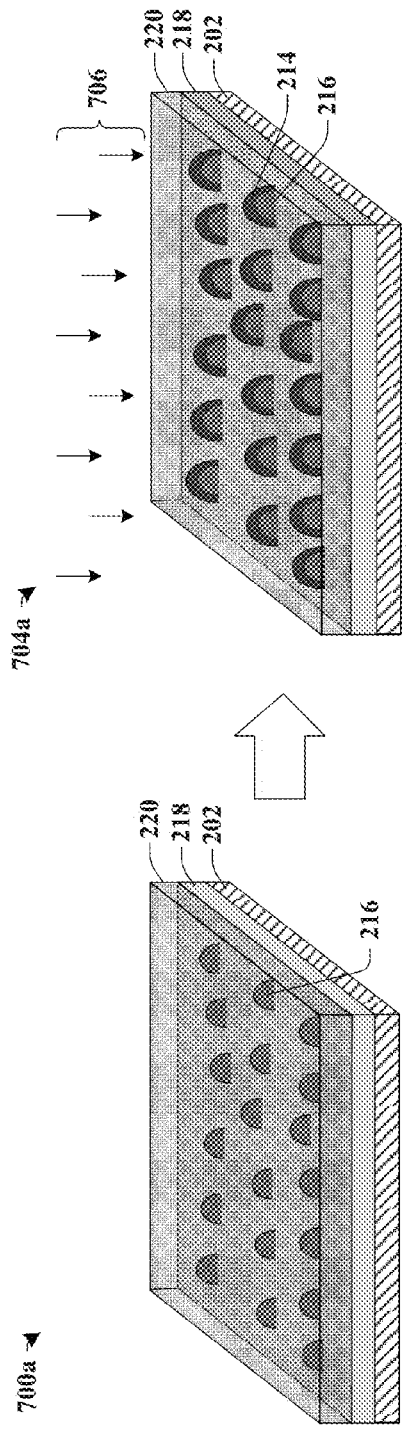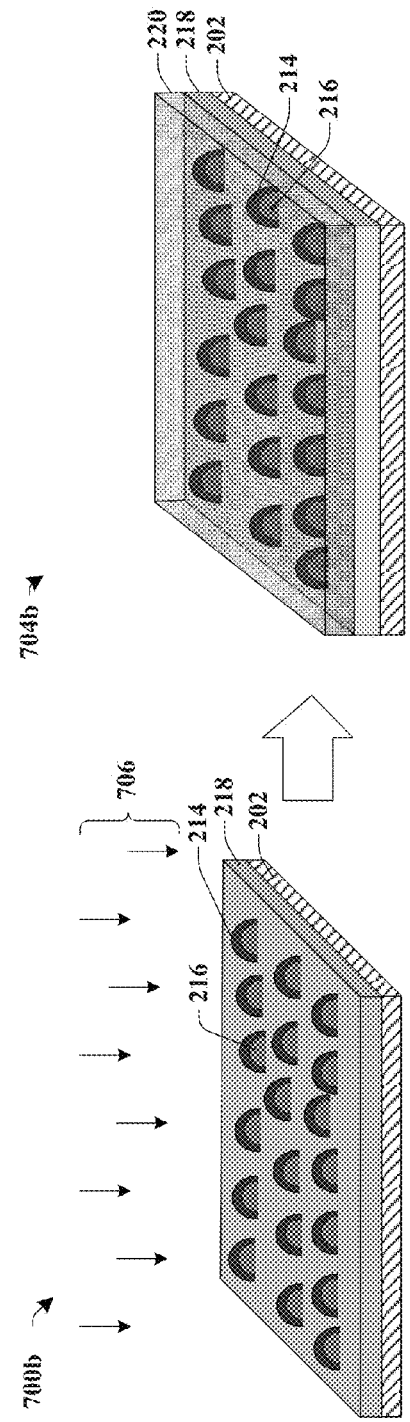
Fig. 7A
Fig. 7B

E-FLASH SI DOT NITROGEN PASSIVATION FOR TRAP REDUCTION

BACKGROUND

Flash memory is used in a wide variety of electronic applications. Some flash memory cells utilize a floating gate field-effect transistor (FET), which stores one or more bits of data in the form of an electric charge within a "floating" gate. The floating gate resides between a channel region and a control gate of the FET, but is electrically-isolated from both by an oxide layer. Data is written to the memory cell when the FET is in an "on" state (i.e., when current flows between a source and drain) by applying a voltage to the control gate, which causes electrons to tunnel from the channel region into the floating gate. Because the floating gate is electrically-isolated from the channel region and the control gate, electrons that tunnel into it will remain there indefinitely.

Electric charge trapped within the floating gate screens the electric field from the control gate within the channel region, which selectively changes the threshold voltage ($V_t$) of the FET. For flash memory devices that use an array of memory cells, the stored data can be read out of the array by measuring which cells have a higher $V_t$ (e.g., store a "1") and which cells have a lower $V_t$ (e.g., store a "0"). Multi-bit cells are also possible, where a single memory cell has more than two discrete $V_t$ states corresponding to more than two data states.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5-7B depict a series of incremental manufacturing steps as a series of 3D (three dimensional) views, according to the method of FIG. 4.

DETAILED DESCRIPTION

Figure 1:
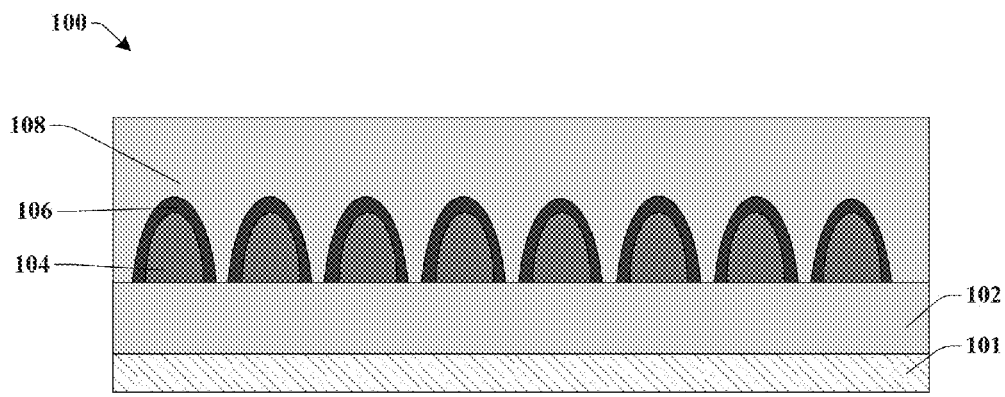
FIG. 1 illustrates a cross-sectional view of a charge trapping structure where a passivation layer resides over a plurality of quantum dots (i.e., nanocrystals), according to some embodiments of the present disclosure.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A typical flash memory comprises a memory array having a large number of memory cells arranged in blocks. One of the most commonly known flash memories is the one-transistor flash memory, wherein each of the memory cells is fabricated as a field-effect transistor having a control gate and a floating gate. The floating gate may comprise a charge trapping structure, which may comprise silicon (Si) dots that are sandwiched between a bottom (tunnel) oxide layer and a top (control) oxide layer. Charge, in the form of electrons or holes, can become selectively trapped on (or selectively stripped from) the layer of Si dots based on the bias conditions applied to the control gate.

During the growth of the top oxide layer, defects may occur at an interface between Si dots and the top oxide layer. The defects cause the transition between the Si dot and the top oxide layer, a region with dangling bond defects which appear because of the mismatch in the structural lattice of the two materials. Unpaired electrons are present at dangling bond sites due to atomic vacancies that become trap sites. Charge carriers entering or leaving the Si dots may get trapped in these trap sites causing unexpected delays in program and erase operations of a flash memory cell.

Accordingly, the present disclosure relates to a new structure and processing method that includes a passivation layer at the interface between Si dots and the top oxide layer. In some embodiments, the structure comprises a semiconductor substrate having a tunnel dielectric layer disposed over a semiconductor substrate. A plurality of quantum dots are disposed over the tunnel dielectric layer and a passivation layer is disposed over the plurality of quantum dots. A top dielectric layer is disposed over the passivation layer. The passivation layer causes atoms (e.g., nitrogen atoms) to occupy the atomic vacancies, thereby deactivating unpaired electrons present at an interface between the quantum dots and the dielectric layer, and significantly reducing the number of dangling bonds present at the interface.

Although some implementations are illustrated below with regards to split gate thin film storage embedded flash (SG TFS e-flash) memory, it will be appreciated that this concept is not limited to split gate flash memory cells, but is also applicable to other types of flash memory cells as well.

FIG. 1 illustrates a cross-sectional view of a charge trapping structure 100 for flash memory, where a passivation layer resides over a plurality of quantum dots, according to some embodiments of the present disclosure.

The charge trapping structure 100 comprises a tunnel dielectric layer 102. The tunnel dielectric layer 102 can be an oxide in some embodiments. In some embodiments, the tunnel dielectric layer 102 may have a thickness such that the tunnel dielectric layer 102 corresponds to an energetic tunnel barrier for electrons whereby electrons can quantum-mechanically tunnel from a channel region in a substrate 101 through the tunnel dielectric layer 102 onto quantum dots 104 arranged over the tunnel dielectric layer 102 (or vice versa). In some embodiments, the quantum dots 104 can be silicon (i.e., a silicon dot). For example, in some embodiments, the tunnel dielectric layer 102 can be made of SiO2 having a predetermined thickness of less than approximately 100 angstroms.

A top dielectric layer 108 resides over the quantum dots 104 and the tunnel dielectric layer 102. A passivation layer 106 is disposed at an interface between the quantum dots 104 and the top dielectric layer 108. The passivation layer 106 comprises one or more passivating agents configured to occupy vacancies of dangling bonds at an interface between quantum dots 104 and top dielectric layer 108. Occupying vacancies of dangling bonds around the quantum dots mitigates trap sites, which can trap charge carriers and cause delay in program and erase operation of the charge trapping structure 100. In some embodiments, the passivation layer 106 may comprise a nitride passivation layer having silicon and nitrogen (e.g., silicon nitride). In such embodiments, nitrogen atoms occupy vacancies of the dangling bonds. Nitrogen has a comparable energy level to that of Si and hence adding the nitrogen passivation layer at the interface would not disturb the energy barrier levels involved in the erase operation. In other embodiments, the passivation layer 106 may have other passivating agents, such as oxygen ($O_2$) or helium (He), for example.

In some embodiments, the passivation layer 106 is arranged conformally around one or more outer surfaces of the quantum dots 104. For example, the passivation layer 106 may be arranged conformal to surfaces of the quantum dots 104 that are not abutting the tunnel dielectric layer 102. In some embodiments, the quantum dots 104 are nested within the passivation layer 106. In some embodiments, the quantum dots 104 and the passivation layer 106 abut the tunnel dielectric layer 102 along a substantially flat surface. In some embodiments, the passivation layer 106 may have a thickness that is less than or equal to approximately 30 angstroms.

In some embodiments, the top dielectric layer 108 conformally overlies the passivation layer 106. The top dielectric layer 108 can be an oxide in some embodiments. In some embodiments, the top dielectric layer 108 may have a predetermined thickness such that the top dielectric layer 108 corresponds to an energetic tunnel barrier for electrons whereby electrons can quantum-mechanically tunnel from above the top dielectric layer 108 onto the quantum dots 104 (or vice versa). In some embodiments, the top dielectric layer 108 may comprise of SiO2 having a predetermined thickness of less than approximately 250 angstroms. In other embodiments, the tunnel dielectric layer 102 and the top dielectric layer 108 may comprise different materials and/or have different thicknesses.

Figure 2A:
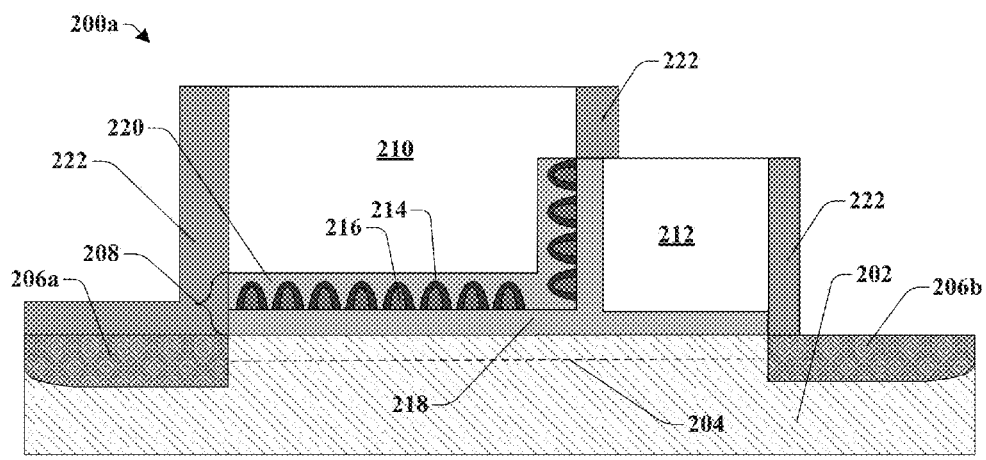
FIG. 2A illustrates a cross-sectional view of a flash memory cell formed following a select gate first process flow, according to some embodiments of the present disclosure.
Figure 2B:
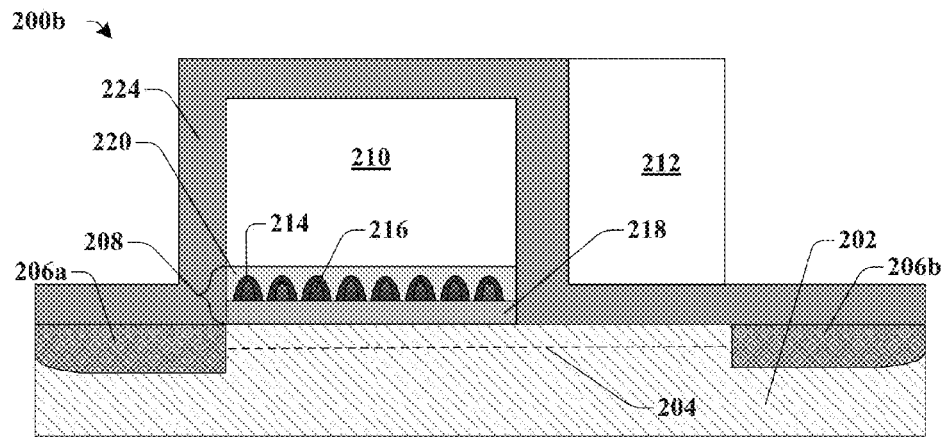
FIG. 2B illustrates a cross-sectional view of a flash memory cell formed following a control gate first process flow, according to some embodiments of the present disclosure.

It will be appreciated that flash memories are usually formed according to two different process flows; a select gate first (control gate last) process flow where a select gate is formed before a control gate, and a control gate first (select gate last) process flow where a control gate is formed before a select gate. FIGS. 2A-2B illustrate some embodiments of cross-sectional views of flash memory cells, 200a and 200b, formed according to select gate first and control gate first process flows.

FIG. 2A illustrates a cross-sectional view of a flash memory cell 200a, formed following a select gate first process flow, according to some embodiments of the present disclosure.

Memory cell 200a comprises a Si substrate 202. Source/drain regions, 206a and 206b, are disposed within the Si substrate 202. The source/drain regions, 206a and 206b, are separated by a channel region 204, which has a charge trapping structure 208 arranged over it. Memory cell 200a further includes a control gate (CG) 210 and a select gate (SG) 212 overlying the channel region 204. The CG 210 resides over the charge trapping structure 208 and the SG 212 resides over the Si substrate 202, adjacent a neighboring sidewall of the CG 210. The charge trapping structure 208 is arranged over the Si substrate 202 in such a way that it separates the CG 210 and SG 212 along their neighboring sidewalls.

The charge trapping structure 208 comprises a nitride passivation layer 214 arranged over Si dots 216. The charge trapping structure 208 further comprises a tunnel oxide layer 218 and a top oxide layer 220. The tunnel oxide layer 218 may also extend below the SG 212 and the CG 210, so that the tunnel oxide layer 218 separates the SG 212 and the CG 210 from a top surface of the Si substrate 202. The tunnel oxide layer 218 also extends laterally between the SG 212 and the CG 210, so that the tunnel oxide layer 218 separates the SG 212 from the CG 210. The top oxide layer 220 and the tunnel oxide layer 218 extend below the CG 210 and laterally between the CG 210 and the SG 212. Sidewall spacers 222 abut outer sidewalls of both the SG 212 and CG 210. In some embodiments, the sidewall spacers may have top surfaces that are aligned with a top surface of the CG 210. In some embodiments, one or more of the sidewall spacers 222 may abut a top surface of the SG 212.

FIG. 2B illustrates a cross-sectional view of a flash memory cell 200b, formed following a control gate first process flow, according to some embodiments of the present disclosure.

Memory cell 200b comprises a spacer layer 224 residing over a top surface of the Si substrate 202. The spacer layer 224 laterally separates the CG 210 and the Si substrate 202 from the SG 212. In some embodiments, the spacer layer 224 may comprise a dielectric layer such as an oxide, for example. The charge trapping structure 208 is arranged under the CG 210 and separates the CG 210 from the top surface of the Si substrate 202. In some embodiments, the charge trapping structure 208 may have sidewalls that are aligned with sidewalls of the CG 210.

During operation, a bias can be selectively applied to the CG 210 to drive charge carriers from a source region 206a into the channel region 204. The charge carriers will be transferred to the Si dots 216 by way of quantum mechanical tunneling to change the amount of charge stored on the Si dots 216. For example, during a program operation, charge is pushed from the channel region 204 into the layer of Si dots 216 by means of hot electron source side injection (SSI).

By changing the amount of charge stored on the Si dots 216, the threshold voltage $V_{th}$ of the memory cell device can be correspondingly changed. For example, to perform a program operation (e.g., write a logical "1") for a memory cell, the CG 210 is biased with a high (e.g., at least an order of magnitude higher) voltage relative a voltage applied across the channel region 204 and/or relative to a voltage applied to the SG 212. The high bias voltage promotes FN (Fowler Nordheim) tunneling of carriers from the channel region 204 towards the CG 210. As the carriers tunnel towards the CG 210 through the tunnel oxide layer 218, the carriers become trapped on the Si dots 216 and alter the $V_{th}$ of the memory cell. To perform a top erase operation (e.g., write a logical "0") for the cell, the CG 210 is biased with a high (e.g., at least an order of magnitude higher) voltage relative to a voltage applied across the channel region 204 and/or relative to a voltage applied to the SG 212. The high bias voltage promotes FN tunneling of carriers from the Si dots 216 towards the CG 210, thereby removing carriers from the Si dots 216 and again changing the $V_{th}$ of the cell in a predictable manner.

Subsequently, during a read operation, a voltage is applied to the SG 212 to induce part of the channel region 204 to conduct. Application of a voltage to the SG 212 attracts carriers to part of the channel region 204 adjacent to the SG 212. While the SG 212 voltage is applied, a voltage greater than $V_{th}$, but less than $V_{th}+\Delta V_{th}$, is applied to the CG 210 (where $\Delta V_{th}$ is a change in $V_{th}$ due to charge trapped on the floating gate). If the memory cell device turns on (i.e., allows charge to flow between S/D regions 206s, 206b), then it is deemed to contain a first data state (e.g., a logical "0" is read). If the memory cell device does not turn on, then it is deemed to contain a second data state (e.g., a logical "1" is read).

Since erase operation here comprises top erase, the tunneling mechanism here will depend on the thickness of the barriers (dielectric layers) and the electric field strength. During erase operation, electrons fall in to a potential well created by the conduction band of the nitride passivation layer 214. From here, electrons will FN tunnel through a second potential barrier or the top oxide layer 220. FN tunneling through the top oxide layer 220 will help suppress leakage and sustain data retention. Without nitride passivation layer 214, electrons will get trapped in the dangling bonds at the interface between the Si dots 216 and the top oxide layer 220, which will induce delays in programming and erasing. Thus, nitride passivation layer 214 will remove the effects of dangling bonds at the interface and prevents any delays in the program/erase operations.

Figure 3:
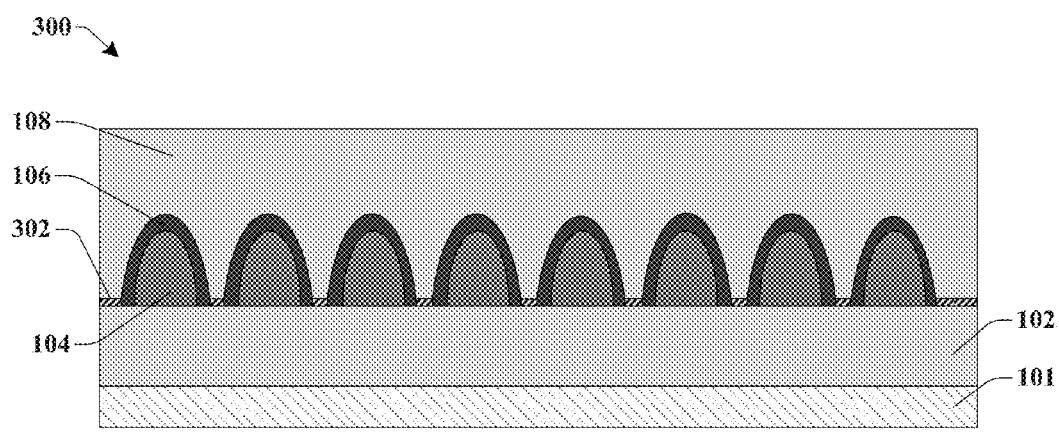
FIG. 3 illustrates a cross-sectional view of a charge trapping layer, where a compound layer comprising nitrogen resides over a top surface of a tunnel oxide, according to some embodiments of the present disclosure.

FIG. 3 illustrates a cross-sectional image of an embodiment of charge trapping structure 300 having a compound layer 302 comprising nitrogen arranged over the tunnel dielectric layer 102.

As shown in FIG. 3, charge trapping structure 300 comprises a passivation layer 106 arranged conformally onto an upper surface of the quantum dots 104. A compound layer 302 is disposed at an interface of the tunnel dielectric layer 102 and the top dielectric layer 108 at locations that are laterally arranged between the quantum dots 104. The compound layer 302 comprises a dielectric layer (e.g., an oxide layer) having an elevated nitrogen content relative to the top dielectric layer 108 and tunnel dielectric layer 102. The elevated nitrogen content is due to the accumulation of nitrogen at an interface of the tunnel dielectric layer 102 and the top dielectric layer 108 during formation of the passivation layer 106.

Figure 4:
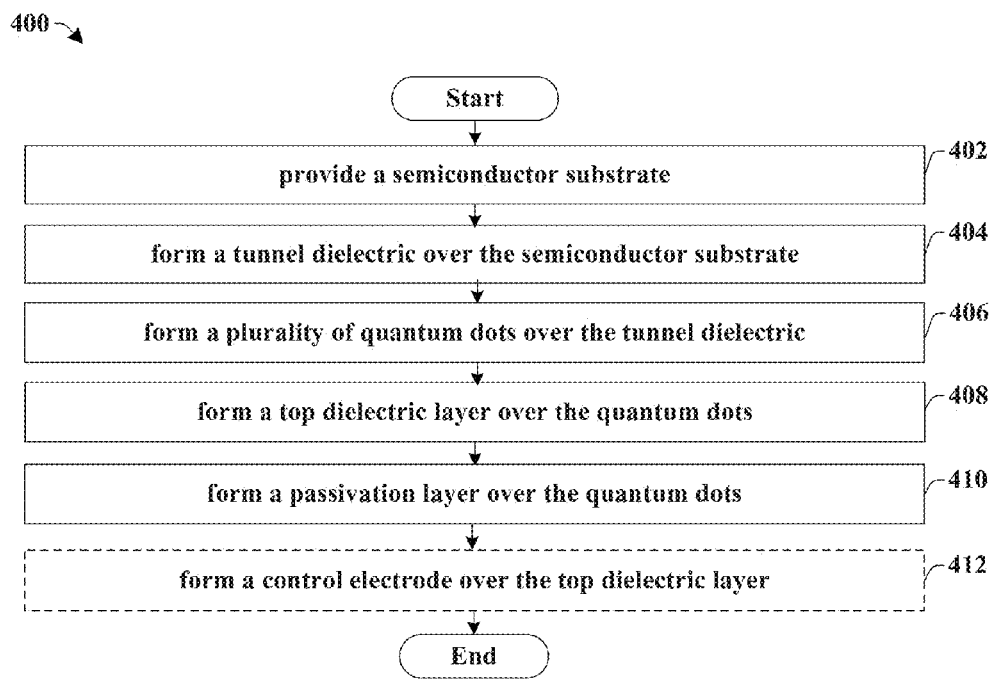
FIG. 4 shows an example of a method in flowchart format in accordance with some embodiments of the present disclosure.

FIG. 4 shows an example of a method 400 in flowchart format in accordance with some embodiments of the present disclosure. While disclosed method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a semiconductor substrate is provided.

At 404, a tunnel dielectric layer is formed over the semiconductor substrate. In some embodiments, the tunnel dielectric comprises SiO2, and the thickness of the tunnel dielectric is less than 100 angstroms. In various embodiments, the tunnel dielectric layer may be formed using a thermal oxidation process, a vapor deposition technique (e.g., PVD, CVD, PE-CVD, etc.) or an atomic layer deposition (ALD).

At 406, a plurality of quantum dots are formed over the tunnel dielectric. In some embodiments, the plurality of quantum dots can be formed by chemical vapor deposition, by rapid thermal anneal of amorphous layers or by other known techniques. In some embodiments, the quantum dots comprise Si and have diameters less than 200 Angstroms.

At 408, a top dielectric layer is formed over the quantum dots. In some embodiments, the top dielectric layer comprises $SiO_2$ and the thickness of the top dielectric layer is less than 250 Angstroms. In various embodiments, the top dielectric layer may be formed using a thermal oxidation process, a vapor deposition technique (e.g., PVD, CVD, PE-CVD, etc.) or an atomic layer deposition (ALD).

At 410, a passivation layer is formed over the quantum dots. In some embodiments, the passivation layer is formed before forming the top dielectric layer (before 408). In other embodiments, the passivation layer is formed after forming the top dielectric layer (after 408). In some embodiments, the passivation layer comprises nitrogen, which is formed by plasma nitridation, remote plasma nitridation, NO anneal, N2O anneal or N2 anneal.

At 412, a control electrode is formed over the top dielectric layer. In some embodiments, the control electrode comprises a metal or polysilicon.

FIGS. 5-7B depict some embodiments of a series of incremental manufacturing steps as a series of 3D views. Although FIGS. 5-7B are described in relation to method 400, it will be appreciated that the structures disclosed in FIGS. 5-7B are not limited to such a method, but instead may stand alone as structures independent of the method.

Figure 5:
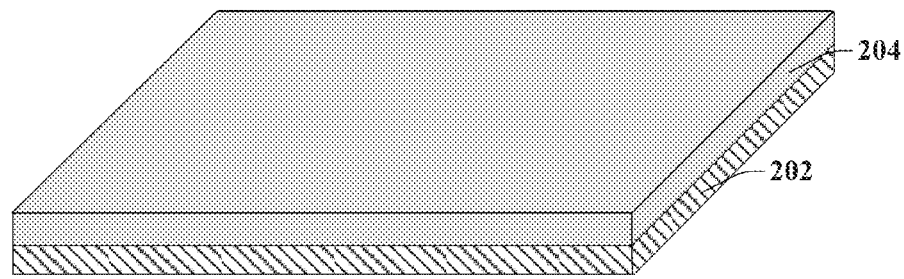

FIG. 5 illustrates some embodiments of a 3D view of a semiconductor body 500 corresponding to acts 402 and 404 of method 400. The semiconductor body 500 includes a semiconductor substrate 202 on which a tunnel oxide layer 218 is formed. In some embodiments, the semiconductor substrate 202 can be a bulk semiconductor substrate (e.g., bulk silicon wafer), a binary compound substrate (e.g., GaAs), a ternary compound substrate (e.g., AlGaAs), or higher order compound substrates, among others; but can also be made of non-semiconductor materials, such as glass or sapphire. The semiconductor substrate 202 can also include a combination of semiconductor material and non-semiconductor material. For example, a bulk semiconductor substrate can also include non-semiconductor materials such as oxide in silicon-on-insulator (SOI), partial SOI substrate, and organic materials, as well as polysilicon, and amorphous silicon, among others. In some embodiments, the semiconductor substrate 202 can include multiple wafers or dies which are stacked or otherwise adhered together. The semiconductor substrate 202 can include wafers which are cut from a silicon ingot, and/or any other type of semiconductor/non-semiconductor and/or deposited or grown (e.g. epitaxial) layers formed on an underlying substrate.

In some embodiments, the tunnel oxide layer 218 comprises $SiO_2$ and the thickness of the tunnel oxide layer 218 is less than 100 Angstroms. In various embodiments, the tunnel oxide layer 218 may be formed using a thermal oxidation process, a vapor deposition technique (e.g. PVD, CVD, PE-CVD, etc.) or an ALD technique. In some embodiments, after formation of the tunnel oxide layer 218, a planarization process may be performed, so that a top surface of the tunnel oxide layer 218 has a substantially topology.

Figure 6:
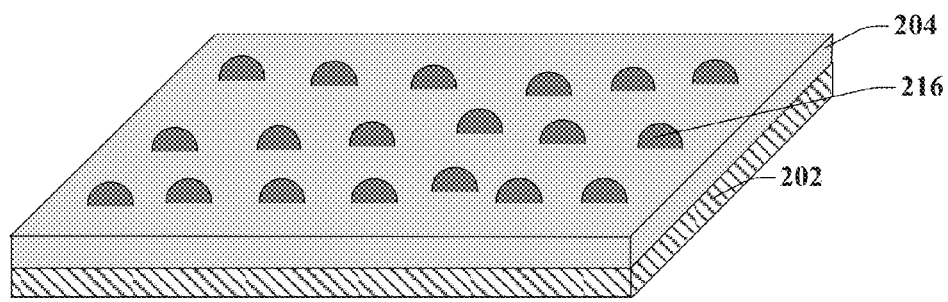

FIG. 6 illustrates some embodiments of a 3D view of a semiconductor body 600, corresponding to act 406 of method 400. Semiconductor body 600, has Si nanocrystals or Si dots 216 disposed over the tunnel oxide layer 218. The Si dots 216 can be made in a variety of sizes with a uniform distribution in particle sizes. Although the Si dots 216 are illustrated as being hemispherical in shape here, or in other words having a rounded upper surface and a flat bottom surface, it will be appreciated that the Si dots 216 can be spherical, oval or amoeba-like in shape. The Si dots 216 can also be made in a variety of sizes with a uniform distribution in particle sizes by appropriate anneal conditions. Although the particles may not be formed in a uniform sphere, they can be described as having a general diameter of approximately less than 200 Angstroms. In some embodiments, Si dots 216 can be formed by chemical vapor deposition, by rapid thermal anneal of amorphous silicon layers or by other known techniques.

FIGS. 7A-7B illustrates some embodiments of 3D views corresponding to acts 408-410 of method 400.

FIG. 7A illustrates 3D views of a semiconductor body, 700a and 702a, corresponding to some embodiments of acts 408 and 410 of method 400. As shown in 3D view 700a, a top oxide layer 220 is formed over the tunnel oxide layer 218 and the Si dots 216. In some embodiments, the top oxide layer 220 is formed by thermal oxidation or by oxide deposition using an ALD process, a PVD process, or a CVD process. In some embodiments, the top oxide layer 220 comprises SiO2 and the thickness of the top oxide layer 220 is less than approximately 250 Angstroms.

As shown in 3D view 702a, the top oxide layer 220 is exposed to a passivation process 704. The passivation process 704 is configured to form passivation layer 214 at an interface of the Si dots 216 and the top oxide layer 220, thereby reducing dangling bonds at an interface between Si dots 216 and top oxide layer 220. Although the passivation layer 214 and underlying Si dots 216 are illustrated in 3D view 702a, it will be appreciated that the dashed outline of Si dot 216 indicates that the passivation layer 214 covers the Si dot 216 (so that the resulting illustration is comparable to a cross-sectional view of the silicon dots 216 and passivation layer 214).

In some embodiments, the passivation process 704 may comprise a plasma nitridation, a remote plasma nitridation, an NO (nitric oxide) anneal, an N2O (nitrous oxide) anneal, or an N2 (nitrogen) anneal. In some embodiments, the anneals may be performed in a process chamber held at a temperature in a range of between approximately 750° C. and approximately 1000° C. In some embodiments, gases (e.g., nitrogen and/or oxygen gases) may be introduced into the processing chamber at a gas flow rate having a range of between approximately 100 sccm and approximately 200 sccm.

In some embodiments, passivation of the Si dots 216 reduces a size of the Si dots 216 since the passivation process 704 consumes some of the Si dot 216 during formation of the passivation layer 214. For example, the formation of a passivation layer 214 having a thickness of approximately 30 angstroms would cause a size of a Si dot 216 having a diameter of approximately 200 angstrom, to be reduced to a diameter of approximately 140 angstroms.

FIG. 7B illustrates 3D views of a semiconductor body, 700b and 702b, corresponding to some alternative embodiments of acts 408 and 410 of method 400. As shown in 3D view 700b, a passivation process 704 is configured to form a passivation layer 214 onto exposed surfaces of the Si dots 216, thereby reducing dangling bonds on the exposed surfaces of the Si dots 216. The passivation layer 214 is formed over the Si dots 216 in such a way that they conformally cover top surfaces of the Si dots 216 (so that the resulting illustration is comparable to a cross-sectional view of the Si dots 216 and passivation layer 214). In some embodiments, the passivation layer 214 comprises a nitride layer which is formed by a passivation process 704 comprising a plasma nitridation, a remote plasma nitridation, an NO anneal, an N2O anneal, or an N2 anneal.

As shown in 3D view 702b, the top oxide layer 220 is formed over the Si dots 216, after formation of passivation layer 214. The top oxide layer 220 abuts the passivation layer 214 and the tunnel oxide layer 218.

After formation of the passivation layer 214 and the top oxide layer 220, a control electrode (i.e., a control gate) may be formed over the top oxide layer 220, corresponding to act 412 of method 400 (not shown). In some embodiments, a control electrode layer is deposited over the top oxide layer 220, and with a protective mask in place, an etching process is carried out to carefully pattern the layers and form a control electrode structure. In various embodiments, the layers may be etched using a dry etchant (e.g., an RIE etch, a plasma etch, etc.) or a wet etchant (e.g., hydrofluoric acid). In some embodiments, the control electrode comprises a metal or poly-silicon. After formation of the control electrode, a select gate (SG) is formed near a sidewall of the control electrode. Even though the above mentioned process illustrates a control electrode first process, it will be appreciated that this disclosure is applicable to a SG first process flow, where a SG is formed first, followed by the formation of a control electrode.

Figure 8A:
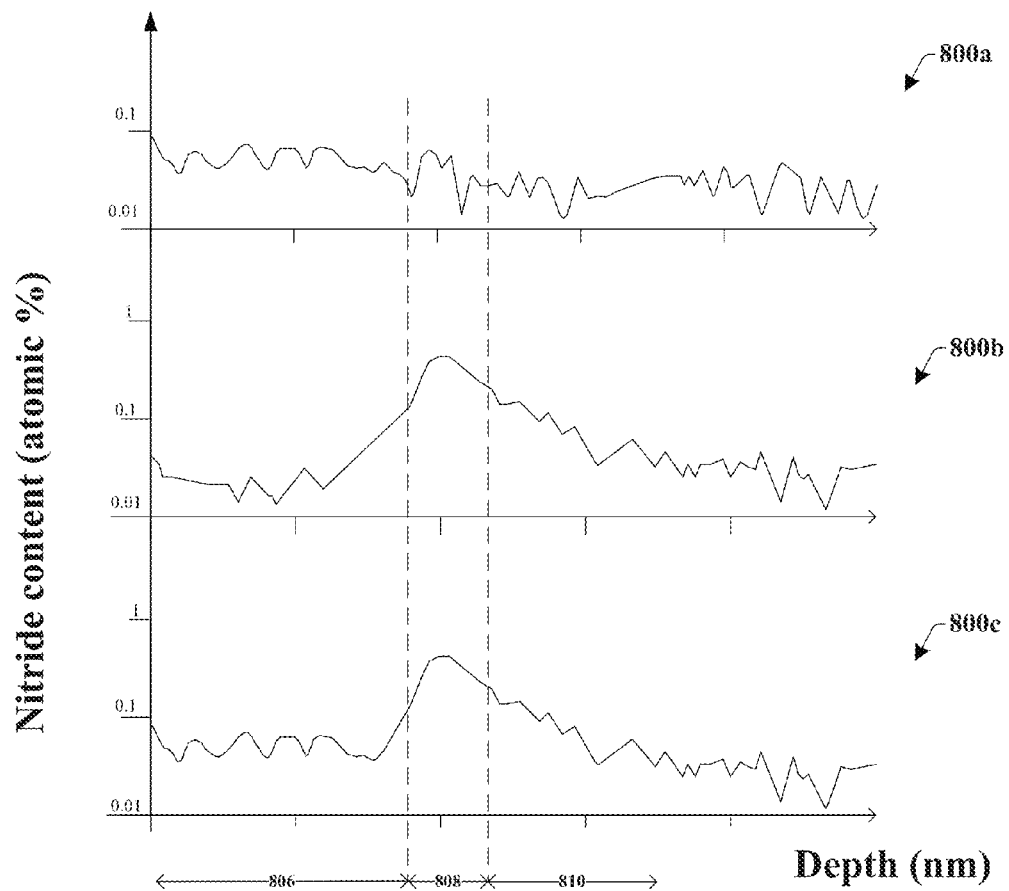
FIGS. 8A-8B illustrate a graphical representation of a SIMS (secondary ion mass spectroscopy) depth profile, of a charge trapping layer, according to some embodiments of the present disclosure.
Figure 8B:
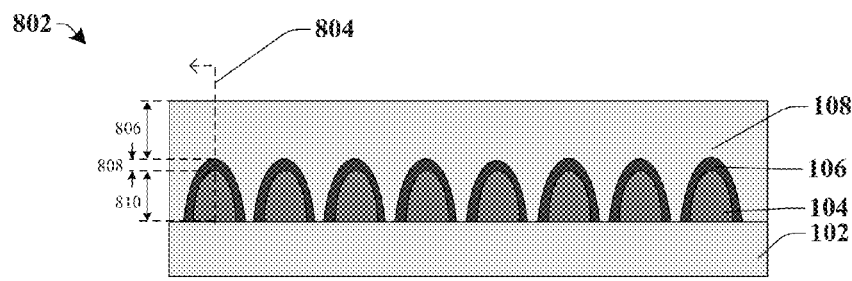

FIG. 8A illustrates some exemplary SIMS (secondary ion mass spectroscopy) depth profiles 800a-800c showing nitrogen content of various embodiments, according to the present disclosure. The SIMS depth profiles 800a-800c show depth on the x-axis and nitrogen content in atomic weight percentage along the y-axis. FIG. 8B illustrates a cross-sectional view of a semiconductor body 802, which illustrates thickness profile along vertical line 804 including thickness 806 of top dielectric layer 108, thickness 808 of passivation layer 106 and thickness 810 of quantum dots 104. These depths or thicknesses of top dielectric layer 108, passivation layer 106, and the quantum dots 104 are represented along the x-axes as 806, 808 and 810 respectively.

SIMS depth profile 800a illustrates an embodiment where there is no nitride passivation. As shown in SIMS depth profile 800a, the nitrogen content is less than approximately 0.1% along the depths 806, 808 and 810.

SIMS depth profile 800b illustrates another embodiment where nitride passivation layer is formed before formation of the top dielectric layer 108. As shown in SIMS depth profile 800b, the nitrogen content rises to a peak (having a value of greater than 0.1%) corresponding to a depth 808 of the passivation layer 106. The peak indicates that the nitrogen content in the passivation layer 106 is greater than the nitrogen content in the top oxide (depth 806) or the Si dot (depth 810).

SIMS depth profile 800c illustrates yet another embodiment where nitride passivation layer is formed after formation of the top dielectric layer 108. As shown in SIMS depth profile 800c, the nitrogen content rises to a peak (having a value of greater than 0.1%) corresponding to a depth 808 of the passivation layer 106. The nitrogen content is slightly higher than 800b along SIMS depth 806 in this case because some nitrogen might remain on the top dielectric layer 108 due to the formation of passivation layer 106 after formation of the top dielectric 108.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

The present disclosure relates to a structure and method for forming a passivation layer over a plurality of charge trapping quantum dots in a memory cell. The passivation layer reduces or even eliminates dangling bonds at an interface between quantum dots and a top dielectric layer.

In one embodiment, the present disclosure relates to a flash memory cell comprising, a semiconductor substrate, a tunnel dielectric layer disposed over the semiconductor substrate, a plurality of quantum dots disposed over the tunnel dielectric layer, a passivation layer disposed over the plurality of quantum dots, and a top dielectric layer disposed over the passivation layer.

In another embodiment, the present disclosure relates to a split gate flash memory cell comprising, a silicon (Si) substrate, source and drain regions disposed within the Si substrate, wherein a channel region is defined between the source and drain regions, an oxide layer disposed over the channel region, a plurality of Si dots disposed within the oxide layer, a nitride passivation layer disposed over the Si dots within the oxide layer, a control gate (CG) disposed above the oxide layer, and a select gate (SG) arranged adjacent to one of the sidewalls of the CG.

In yet another embodiment, the present disclosure relates to a method of forming a split gate flash memory cell comprising, providing a semiconductor substrate, forming a tunnel dielectric layer over the semiconductor substrate, forming plurality of Si (silicon) dots over the tunnel dielectric layer, forming a top dielectric layer over the Si dots, and forming a nitride passivation layer at an interface between the Si dots and the top dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flash memory cell comprising:
a semiconductor substrate;
a tunnel oxide layer disposed over the semiconductor substrate;
a plurality of quantum dots respectively having a hemispherical shape, which are disposed on and in direct contact with an upper surface of the tunnel oxide layer;
a passivation layer comprising a plurality of discrete segments respectively disposed over a corresponding one of the plurality of quantum dots and on and in direct contact with the upper surface of the tunnel oxide layer;
a compound layer comprising a plurality of individual sections disposed vertically over and in contact with the upper surface of the tunnel oxide layer, wherein the plurality of individual sections have sidewalls that contact sidewalls of the discrete segments of the passivation layer, and wherein the compound layer comprises a different material than that of the passivation layer; and
a top oxide layer disposed over the passivation layer and the compound layer, wherein the top oxide layer laterally separates an outermost sidewall of a first discrete segment of the plurality of discrete segments of the passivation layer partially surrounding a first one of the plurality of quantum dots from an outermost sidewall of a second discrete segment of the plurality of discrete segments of the passivation layer partially surrounding a second one of the plurality of quantum dots.

2. The flash memory cell of claim 1, wherein the passivation layer conformally overlies the plurality of quantum dots.

3. The flash memory cell of claim 1, wherein the top oxide layer conformally overlies the passivation layer.

4. The flash memory cell of claim 1, wherein:
the semiconductor substrate comprises silicon;
the plurality of quantum dots comprise silicon nanocrystals;
the tunnel and the top oxide layers comprise silicon dioxide; and
the passivation layer comprises nitrogen, hydrogen, helium, or oxygen.

5. The flash memory cell of claim 1, further comprising:
a source region and a drain region disposed within the semiconductor substrate;
a control gate (CG) disposed above the top oxide layer and arranged over a region of the semiconductor substrate that is between the source and drain regions; and
a select gate (SG) disposed over the semiconductor substrate, adjacent a neighboring sidewall of the CG.

6. The flash memory cell of claim 1,
wherein the plurality of quantum dots respectively comprise a rounded upper surface and a flat bottom surface extending between outermost lateral boundaries of a quantum dot and abutting the tunnel oxide layer; and wherein the passivation layer has a lower surface that is co-planar with the flat bottom surface.

7. The flash memory cell of claim 1, wherein the passivation layer comprises nitrogen.

8. The flash memory cell of claim 1,
wherein the plurality of quantum dots have a first flat lower surface that contacts the upper surface of the tunnel oxide layer; and
wherein the passivation layer has a second flat lower surface that is co-planar with the first flat lower surface and a third flat lower surface of the compound layer.

9. The flash memory cell of claim 1, wherein the top oxide layer has a non-planar bottom surface and a planar top surface.

10. The flash memory cell of claim 1, wherein the passivation layer has a bottom surface that is substantially co-planar with a bottom surface of the plurality of quantum dots and that is in direct contact with the tunnel oxide layer.

11. The flash memory cell of claim 1, wherein the compound layer has an elevated nitrogen content relative to the top oxide layer.

12. The flash memory cell of claim 1,
wherein the plurality of individual sections of the compound layer respectively have opposing sidewalls that contact sidewalls of the discrete segments of the passivation layer; and
wherein the plurality of individual sections of the compound layer have uppermost surfaces below tops of the plurality of quantum dots.

13. A flash memory cell comprising:
a silicon (Si) substrate;
source and drain regions disposed within the Si substrate, wherein a channel region is defined between the source and drain regions;
a tunnel oxide layer disposed over the channel region and having an upper surface;
a plurality of silicon dots contacting the upper surface of the tunnel oxide layer;
a nitride passivation layer comprising a plurality of discrete segments respectively disposed on and in contact with a corresponding one of the plurality of silicon dots and the upper surface of the tunnel oxide layer;
a top oxide layer disposed over the nitride passivation layer;
a compound layer comprising a plurality of individual sections disposed vertically over and in contact with the upper surface of the tunnel oxide layer and having sidewalls that contact sidewalls of the plurality of discrete segments of the nitride passivation layer, wherein the compound layer comprises a different material than that of the nitride passivation layer;
a control gate (CG) disposed above the top oxide layer; and
a select gate (SG) arranged adjacent to a neighboring sidewall of the CG.

14. The flash memory cell of claim 13, wherein the nitride passivation layer has a thickness that is less than or equal to approximately 30 angstroms.

15. The flash memory cell of claim 13, wherein:
the nitride passivation layer is conformal over outer surfaces of the plurality of silicon dots.

16. A flash memory cell comprising:
a semiconductor substrate;
a tunnel dielectric layer disposed over the semiconductor substrate;
a plurality of quantum dots respectively having a hemispherical shape, which are arranged on and in direct contact with an upper surface of the tunnel dielectric layer;
a passivation layer disposed over the plurality of quantum dots, wherein the passivation layer contacts the plurality of quantum dots and the upper surface of the tunnel dielectric layer;
a top dielectric layer disposed over the passivation layer;
a compound layer having a lower surface contacting the upper surface of the tunnel dielectric layer, an upper surface contacting the top dielectric layer, and sidewalls contacting sidewalls of the passivation layer, wherein the upper surface of the compound layer is below a top surface of the passivation layer and wherein the compound layer comprises a different material than that of the passivation layer; and
wherein the passivation layer has a curved upper surface facing the top dielectric layer.

17. The flash memory cell of claim 16, wherein the top dielectric layer laterally separates an outermost sidewall of a discrete segment of the passivation layer that partially surrounds a quantum dot from an outermost sidewall of an adjacent discrete segment of the passivation layer that partially surrounds an adjacent quantum dot of the plurality of quantum dots.

18. The flash memory cell of claim 16, wherein:
the semiconductor substrate comprises silicon;
the plurality of quantum dots comprise silicon nanocrystals;
the tunnel and the top dielectric layers comprise silicon dioxide; and
the passivation layer comprises nitrogen, hydrogen, helium or oxygen.

19. The flash memory cell of claim 16, further comprising:
a source region and a drain region disposed within the semiconductor substrate;
a control gate (CG) disposed above the top dielectric layer and arranged over a region of the semiconductor substrate between the source and drain regions; and
a select gate (SG) disposed over the semiconductor substrate, adjacent a neighboring sidewall of the CG.

20. The flash memory cell of claim 16, wherein the plurality of quantum dots respectively have a rounded upper surface and a flat bottom surface abutting the tunnel dielectric layer.

21. The flash memory cell of claim 16, wherein the passivation layer comprises nitrogen.

* * * * *